United States Patent [19]

Luryi

[11] Patent Number: 5,309,003
[45] Date of Patent: May 3, 1994

[54] ARTICLE COMPRISING A REAL SPACE TRANSFER SEMICONDUCTOR DEVICE, AND METHOD OF MAKING THE ARTICLE

[75] Inventor: Sergey Luryi, Bridgewater, N.J.
[73] Assignee: AT&T Bell Laboratories, Murray Hill, N.J.
[21] Appl. No.: 843,654
[22] Filed: Feb. 28, 1992
[51] Int. Cl.[5] .................. H01L 29/161; H01L 29/80
[52] U.S. Cl. .................................. 257/194; 257/13; 257/96; 257/192; 257/252
[58] Field of Search ............... 257/194, 13, 184, 192, 257/197, 252, 96, 97

[56] References Cited

U.S. PATENT DOCUMENTS

| | | | |
|---|---|---|---|
| 4,675,717 | 6/1987 | Herrero et al. | 357/71 |
| 4,686,550 | 8/1987 | Capasso et al. | 257/194 |
| 4,727,403 | 2/1988 | Hida et al. | 257/194 |
| 4,903,092 | 2/1990 | Luryi et al. | 357/22 |
| 4,933,728 | 6/1990 | Fukuzawa et al. | 257/13 |
| 4,999,687 | 3/1991 | Luryi et al. | 357/16 |
| 5,008,891 | 4/1991 | Morita | 257/13 |
| 5,021,841 | 6/1991 | Leburton et al. | 257/256 |
| 5,055,891 | 10/1991 | Moll et al. | 257/252 |
| 5,157,467 | 10/1992 | Fujii | 257/192 |

FOREIGN PATENT DOCUMENTS 62-276882 12/1987 Japan .................................. 257/192

OTHER PUBLICATIONS

S. Luryi's chapter in "Heterojunction Band Discontinuities: Physics and Device Applications", F. Capasso et al., editors, Elsevier 1987, pp. 513-539.
"Light-emitting Devices Based on the Real-space Transfer of Hot Electrons", by S. Luryi, *Applied Physics Letters*, vol. 58(16), Apr. 22, 1991 pp. 1727-1729.
"Real-space Transfer in Three-terminal InGaAs-/InAlAs/InGaAs Heterostructure Devices", by P. M. Mensz et al., *Applied Physics Letters*, vol. 56(25), Jun. 18, 1990, pp. 2563-2565.
"Quench of Hot-Electron Real Space Transfer by Electronic Screening", by C. Liu et al., *IEEE Transactions on Electron Devices*, vol. 38, No. 11, Nov. 1991, pp. 2417-2422.
"Improved Microwave Performance in Transistors Based on Real Space Electron Transfer", by M. R. Hueschen, Applied Physics Letters, vol. 57(4), Jul. 23, 1990, pp. 386-388.
"High Frequency Characteristics of Charge-Injection Transistor-Mode Operation in AlGaAs/InGaAs/GaAs Metal-Insulator-Semiconductor Field-Effect Transistors", by K. Maezawa et al, *Japanese Journal of Applied Physics*, vol. 30, No. 6, Jun. 1991, pp. 1190-1193.

*Primary Examiner*—Rolf Hille
*Assistant Examiner*—Mahshid Saadat
*Attorney, Agent, or Firm*—Eugen E. Pacher

[57] ABSTRACT

Real space transfer (RST) semiconductor devices of novel geometry are disclosed. The devices are processed such that, at least in the active region of the devices, bulk semiconductor material is removed, and such that both the channel length $L_{ch}$ and the collector width W are defined lithographically. The channel length is defined by a trench etched through a highly conductive emitter contact layer. The trench is situated directly opposite the collector. Devices according to the invention can have relatively small parasitic capacitance, and therefore are potentially fast. A processing method that can be used to make devices of the novel geometry is also disclosed.

10 Claims, 4 Drawing Sheets

ARTICLE COMPRISING A REAL SPACE TRANSFER SEMICONDUCTOR DEVICE, AND METHOD OF MAKING THE ARTICLE

FIELD OF THE INVENTION

This invention pertains to articles comprising semiconductor devices, including electronic and opto-electronic devices, and to methods of making such articles.

BACKGROUND OF THE INVENTION

Real space transfer (RST) semiconductor devices are known to the art. See, for instance, S. Luryi's chapter in "Heterojunction Band Discontinuities: Physics and Device Applications", F. Capasso et al., editors, Elsevier 1987, especially pages 513–539, incorporated herein by reference.

Known RST devices include a transistor, variously called charge-injection transistor (CHINT) or negative resistance field effect transistor (NERFET), and the hot-electron erasable programmable random access memory ($HE^2PRAM$). See, for instance, U.S. Pat. No. 4,903,092, also incorporated herein by reference. Known RST devices also include a recently disclosed novel logic element (See U.S. Pat. No. 4,999,687, incorporated herein by reference), and a recently disclosed light emitting device (See U.S. patent application Ser. No. 716,751 filed Jun. 18, 1991 for S. Luryi; and S. Luryi, *Applied Physics Letters*, Vol. 58(16), p. 1727; both incorporated herein by reference).

Briefly, RST devices generally are three (or more) terminal devices based on real-space transfer of hot electrons from a first to a second conducting region. The two conducting regions are separated by a barrier region and are contacted independently, with the first conducting region having two (or more) surface contacts (frequently referred to as "source" and "drain"). Application of a source-to-drain bias $V_{sd}$ can lead to heating of charge carriers in the first region and consequent charge injection into the second conducting region. The first region thus acts as a hot carrier emitter and the second region as a collector. This terminology will generally be used herein.

An important requirement in the implementation of a RST device is electrical insulation between emitter and collector layers. Prior art RST devices have used alloyed source and drain contacts, well known in FET technology. However, when used in RST devices, alloyed source-drain contacts have proven themselves capriciously prone to short circuit across the barrier. RST devices with alloyed source-drain contacts thus would at best be difficult to manufacture.

The above referred-to shorting problem was overcome by means of the epitaxial contacts introduced by P. M. Mensz et al. (*Applied Physics Letters*, Vol. 56(25), p. 2563). In this technology, contacts are made to an ultra-heavily doped layer (the emitter contact layer), grown epitaxially over the emitter layer. The contacts are made by depositing suitably patterned contact metal onto the contact layer, such that relatively large contact pads are formed. No alloying is required, and the channel length is defined in a separate step by etching a "trench" of width $L_{ch}$ through the emitter contact layer.

RST devices potentially are very fast, their ultimate performance believed to be limited substantially only by the time of flight of hot carriers (typically electrons) across the barrier layer. However, actual devices have so far fallen short of the potential performance. The main reason for this performance shortfall is associated with the existence of relatively large parasitic capacitances in prior art RST devices. For instance, associated with the above-discussed epitaxial contact devices (Mensz et al., op. cit.; see also C.-T. Liu et al., *IEEE Transactions on Electron Devices*, Vol. 38(11), p. 2417) is parasitic capacitance between the collector and the areas of the emitter layer outside of the trench.

Recently, "top-collector" RST devices were disclosed. See M. R. Hueschen et al., *Applied Physics Letters*, Vol. 57(4), p. 386; and K. Maezawa et al., *Japanese Journal of Applied Physics*, Vol. 30(6), p. 1190. In these devices the lateral extent of the collector is defined by lithography, and can consequently be small. Thus, the above discussed parasitic capacitance can be substantially reduced in such devices. However, the prior art top-collector devices present another problem. As those skilled in the art will appreciate, both source and drain contacts must be self-aligned with the collector, in order to avoid introduction of (speed-degrading) series resistance into the channel. However, alloying of such self-aligned contacts frequently degrades the integrity of the barrier layer, leading to an increase in undesirable parasitic leakage across the barrier.

In view of the many advantageous features of RST devices, including potentially high speed, it would be highly desirable to have available device geometries that can result in devices that are free of, or at least less subject to, some of the shortcomings associated with prior art geometries. This application discloses such devices, and methods for making such devices.

Glossary and Definitions

By "bulk" semiconductor material is meant herein material of the virgin semiconductor wafer, substantially unaltered in the course of device manufacture.

"Epitaxial" semiconductor material herein is semiconductor material deposited on bulk material by epitaxial growth techniques such as CVD, MBE, VPE, LPE, and combinations thereof.

The "active" region of a RST device according to the invention extends in the lateral direction at least from one emitter contact to the other emitter contact (i.e., at least the distance $L_c$), and extends in the longitudinal direction substantially the length of the collector layer.

SUMMARY OF THE INVENTION

A significant aspect of the invention is the realization that attainment of very high speed in RST devices requires that the effective lateral channel width be small (typically $\leq 5$ μm), as well as that the collector have small lateral width W (typically $\leq 50$ μm), with the collector being directly facing the channel, on opposite sides of an epitaxial semiconductor region that comprises the barrier layer of the RST device. The effective lateral channel width is defined by the width ($L_{ch}$) of a "trench" through a highly conducting epitaxial semiconductor layer, the emitter contact layer.

Since the required small lateral features in practice can only be attained by means of lithography and etching, RST devices according to the invention are characterized by lithographically defined small features both on the "top" side and on the "bottom" side of the device. Furthermore, RST devices according to the invention are characterized by the substantial absence of "bulk" semiconductor material in the active region of the device. That is to say, substantially all the semiconductor material in the active region of the device is epitaxial material. I know of no prior art semiconductor device that exhibits these characteristics.

More specifically, one aspect of the invention is an article that comprises an RST device that comprises, in sequence, a first epitaxial semiconductor region, an essentially undoped second epitaxial semiconductor region comprising a semiconductor layer, of thickness less than or equal to 10 $\mu$m (frequently $<5$ or even 1 $\mu$m), in contact with the first region, and a third epitaxial semiconductor region in contact with the second region. Both the first and third regions comprise doped semiconductor material, with the first region comprising a layer having relatively low (typically $<10^{13}/cm^2$) sheet carrier concentration (the layer to be referred to as the "emitter" layer) in contact with the second region. The device further comprises means for making electrical contact to the third semiconductor region, and at least two spaced apart means for making electrical contact to the first semiconductor region. The semiconductor layer in the second region will frequently be referred to as the "barrier" layer. The compositions of the various regions are chosen to meet, inter alia, the known bandgap requirements of a RST device.

The first semiconductor region further comprises a patterned doped layer of epitaxial semiconductor material in contact with the emitter layer, the layer having relatively high (typically $>10^{13}/cm^2$) sheet carrier concentration. This "emitter contact layer" is patterned such that a feature, elongate in the longitudinal direction and of width $L_{ch}$ ($L_{ch} \leq 5$ $\mu$m, frequently $<1$ $\mu$m) in the lateral direction, electrically substantially separates two portions of the emitter contact layer from each other. By this I mean that, absent any external connections, the two portions are electrically connected only through the (low conductivity) emitter layer. Each of said two portions of the emitter contact layer is associated with one of said two spaced apart means for making electrical contact to the first semiconductor region. The elongate feature will frequently be referred to as the "trench".

Still furthermore, the third semiconductor region comprises a layer of doped epitaxial semiconductor material that will frequently be referred to as the collector layer. The collector layer in a device according to the invention typically has a lateral width that is at most 50 $\mu$m, frequently less than 10 or even 3 $\mu$m, and is situated such that the trench is directly opposite the collector layer. The lateral distance $L_c$ between the two spaced apart means for making contact to the emitter contact layer generally is greater than W.

Another aspect of the invention is a method of making an article that comprises a RST device. The method comprises providing a semiconductor body that comprises a bulk semiconductor substrate and a multiplicity of epitaxial semiconductor layers on a major surface of the substrate. The multiplicity of layers comprises, in sequence, a first semiconductor region, an essentially undoped second semiconductor region (comprising the barrier layer), and a third semiconductor region in contact with the barrier layer. The first semiconductor region comprises a layer having relatively high sheet carrier concentration (exemplarily $>10^{13}/cm^2$), and a layer having a relatively low sheet carrier concentration (exemplarily $<10^{13}/cm^2$). The former is the emitter contact layer, and the latter is the emitter layer. The emitter layer is in contact with the emitter contact layer and the barrier layer.

The method further comprises providing means for making electrical contact to the third semiconductor region, and providing at least two spaced apart means for making electrical contact to the emitter contact layer, each of these means comprising a contact metal pad.

Significantly, the method further comprises patterning the semiconductor body such that a, typically elongate, mesa structure of lateral width $W \leq 50$ $\mu$m is formed, the mesa structure comprising the third semiconductor region. The method still further comprises removing substantially all bulk semiconductor material from at least the active region of the device, and forming a, typically elongate, depressed feature (to be referred to as the trench), of width $L_{ch} \leq 5$ $\mu$m, in the active region of the device. The trench is caused to extend through the emitter contact layer to the emitter layer, such that the resulting two portions of the emitter contact layer are electrically connected substantially only through the (low conductivity) emitter layer, and is positioned such that the trench directly faces the mesa structure.

In currently preferred embodiments the method further comprises providing device carrier means that have a first major surface, with patterned conductive material on the first major surface, and affixing the partially processed RST device to the carrier means such that at least one of the three contact metal pads makes electrical contact with the patterned conductive material. Preferred means for affixing the partially processed RST device to the carrier means comprise a unidirectionally conductive interconnection medium, exemplarily a metal particle-containing epoxy. Typically the partially processed device is affixed to the carrier means prior to removal of the substrate material, with the carrier means providing mechanical support to the remaining epitaxial semiconductor material after substrate removal.

No attempt has been made to show realistic dimensions and/or proportions.

DETAILED DESCRIPTION

Figure 8:
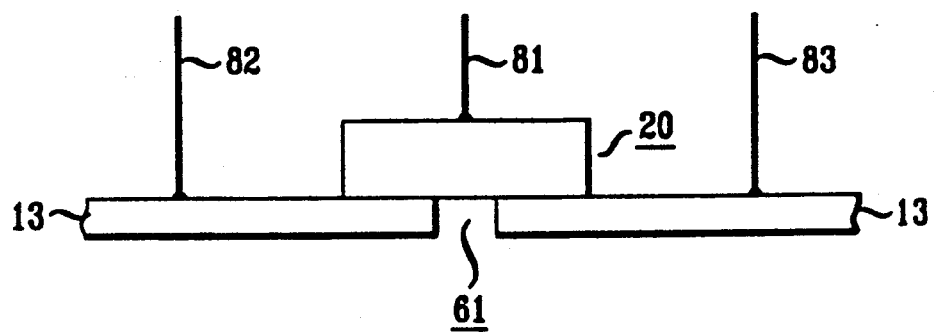
FIG. 8 schematically depicts the geometry of an exemplary device according to the invention.

FIG. 8 schematically depicts the geometry of an exemplary RST device according to the invention. Numerals 13 refer to the two portions of the emitter contact layer, 20 to the mesa structure that typically comprises emitter layer, barrier layer and collector (these are not separately shown), and 61 to the trench that separates the two portions of 13 such that the portions are electrically connected substantially only through the emitter layer. Numerals 81, 82 and 83 refer, respectively, to the collector contact and the two emitter contacts.

The semiconductor portions of the device shown in FIG. 8 consist substantially only of epitaxial semiconductor material. Those skilled in the art will appreciate that a device as shown would be exceedingly fragile, and at best difficult to manufacture by conventional techniques. Thus, in order to attain the benefits that potentially derive from the novel device geometry, a novel method of making a RST device is needed.

It will be understood that, as is conventional, expressions such as InGaAs or InAlAs are not intended to designate the exact stoichiometry of a given material. For instance, InGaAs, lattice matched to InP, has stoichiometry $In_xGa_{1-x}As$, with $x=0.53$. Those skilled in the art know the stoichiometries that result in lattice match to the various possible substrates, as well as those that result in strained layer heterostructures.

A significant aspect of the instant invention is a method of making an RST device. The method will now be described with reference to a InGaAs/InP heterostructure grown on a InP substrate. This is for concreteness only, and those skilled in the art will recognize that other heterostructures (e.g., InGaAs/InAlAs, lattice matched to InP, GaAs/AlGaAs lattice matched to GaAs, or other lattice matched structures; as well as strained layer structures) can be utilized similarly. In general, the novel RST device can be embodied in any semiconductor system that permits attainment of the known bandgap relationships, provided there exists a composition in the system whose etch rate in an appropriate etching medium is substantially lower (typically at most 10%) of the etch rate of another composition in the system (typically the composition of the substrate material). If this condition is met then it will typically be possible to remove the substrate material from at least the active region of the device, as will be explained in more detail below.

Figure 1:
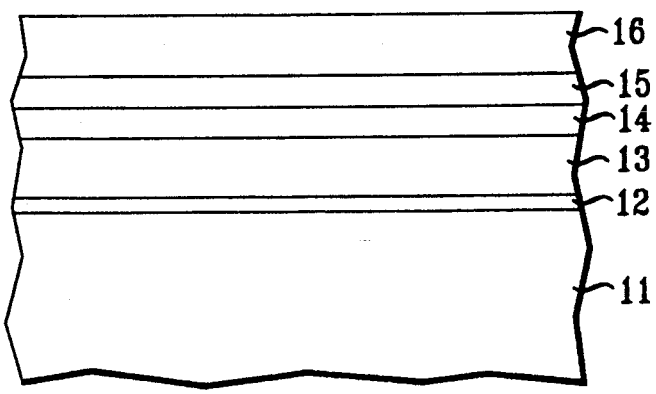
FIG. 1 schematically depicts an exemplary multilayer semiconductor structure that can be used in making a RST device according to the invention.

FIG. 1 schematically depicts an exemplary heteroepitaxial layer structure 10 that can be used in the practice of the invention. Numeral 11 designates a conventional single crystal bulk semiconductor substrate body, e.g., a semi-insulating InP wafer. On one of the two major surfaces of substrate body 11 are grown epitaxial layers 12-16 in conventional fashion. Exemplarily, layer 12 is a 100 nm n+ InGaAs etch stop layer, 13 a 200 nm n++ InP emitter contact layer, 14 a 40 nm n InGaAs emitter (channel) layer, 15 a 100 nm undoped InP barrier layer, and 16 a multilayer collector structure (e.g., 100 nm n+ InGaAs, followed by a 20 nm n++ InGaAs cap layer). It will be recognized that the above exemplary structure is conventional, and that such a structure may in some cases contain more layers, e.g., two etch stop layers. Furthermore, it will be recognized that the collector layer may be, but need not be, chemically homogeneous. For instance, if the desired RST device is a light emitting device then layer 16 typically is not chemically homogeneous, and will contain dopants of opposite polarity from those in the emitter layer. See, for instance, S. Luryi, *Applied Physics Letters*, Vol. 58(16), p. 1727.

In a further exemplary embodiment, layer 12 is a n++ 100 nm InGaAs etch stop/emitter contact layer, and 13 is a second etch stop layer (2.5 nm n+ InP or InAlAs).

Figure 2:
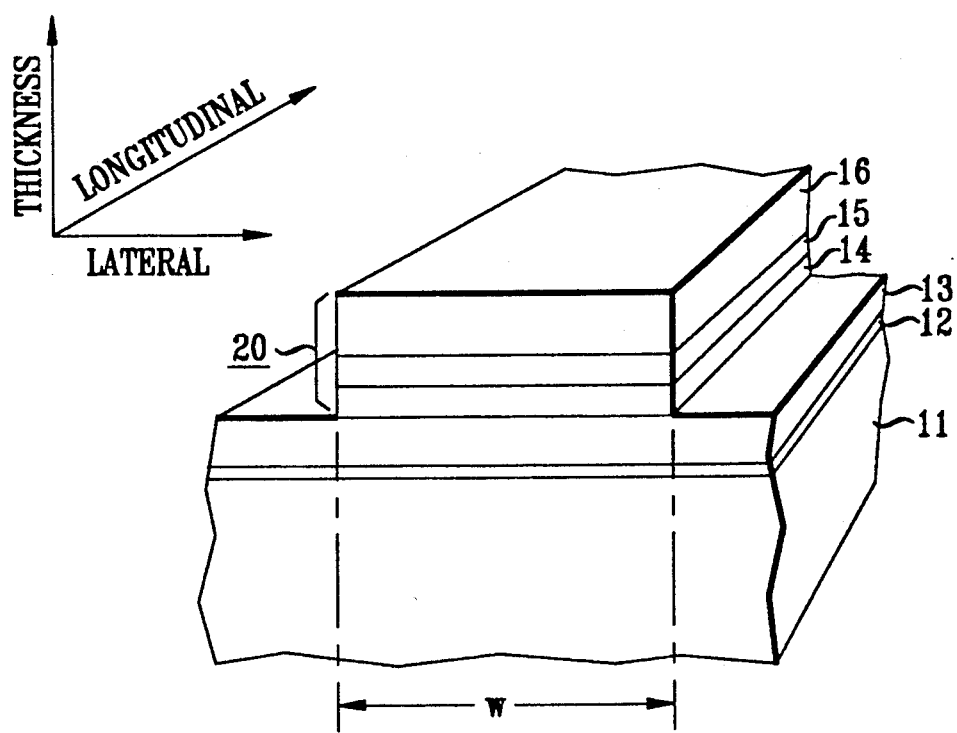
FIGS. 2-5 schematically illustrate intermediate stages in making of the exemplary RST device.

The exemplary heteroepitaxial layer structure 10 is processed by conventional means to form a mesa 20 of width W, as shown schematically in FIG. 2. As is shown in the figure, the width is measured in the lateral direction. Those skilled in the art will appreciate that the mesa's extent in the longitudinal direction (i.e., in the direction that is normal to the lateral direction and is parallel to the major surface of the substrate) frequently, but not necessarily, is greater than its width. This is conventional. FIG. 2 also indicates the third direction associated with the device geometry, namely, the direction in which thicknesses are measured. It will be appreciated that in RST devices having more than two emitter contacts (not necessarily arranged in linear fashion), the trench is not necessarily a linear feature.

Figure 3:
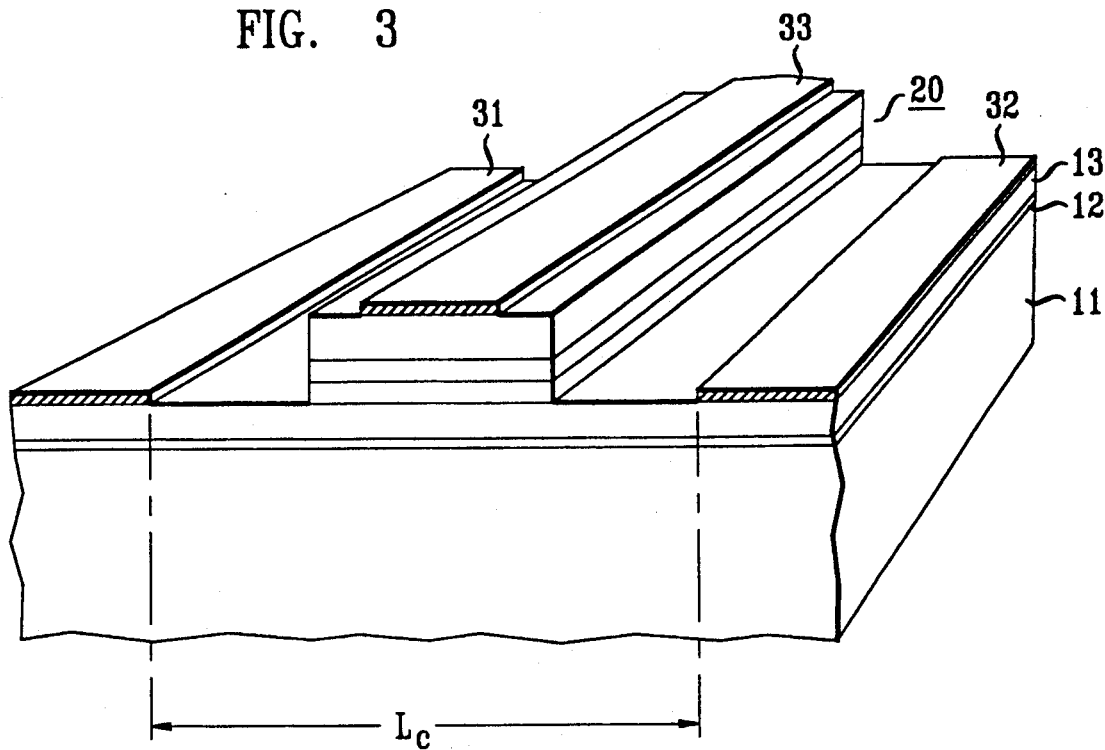

In the exemplary embodiment emitter and collector contacts (typically ohmic contacts) are applied subsequent to mesa formation by conventional means. The resulting structure is schematically shown in FIG. 3, wherein numerals 31 and 32 refer to the emitter contacts (spaced a distance $L_c$ apart), and numeral 33 refers to the collector contact.

Subsequently an appropriate dielectric layer (e.g., $Si_3N_4$) is deposited over the patterned heterostructure, vias are formed, and a final metal pattern (e.g., Au or Al) deposited, all in conventional fashion. The resulting structure is schematically shown in FIG. 4, wherein numerals 41 refer to the dielectric layer, numerals 42 and 43 refer to the emitter contact pads, and 44 refers to the collector contact pad.

Figure 4:
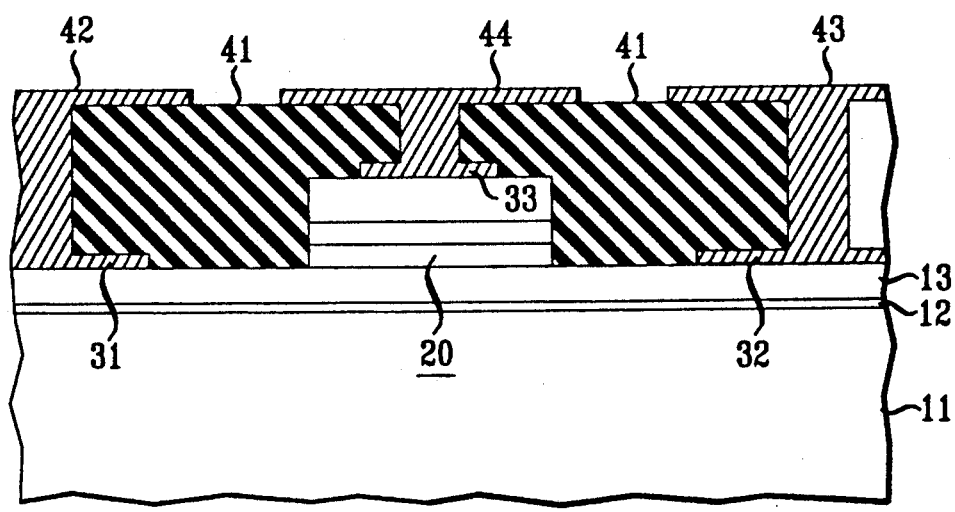

Those skilled in the art will recognize that the multilayer structure of FIG. 4 cannot yet function as an RST device, since highly conducting emitter contact layer 13 shorts the emitter layer 14, preventing significant carrier heating. It is an objective of processing steps subsequent to the above described processing to cut a trench through contact layer 13 from below (i.e., from the "substrate side"), thereby defining the effective channel length $L_{ch}$ of the resulting RST device. This can be accomplished as follows.

The multilayer structure (either as part of a wafer, or as a separate device structure, after appropriately dividing a wafer in known fashion) is mounted mesa-side down on an appropriate carrier body. The carrier body can comprise any suitable material, including multilayer ceramics, Si or polymer, but preferably comprises material whose thermal expansion coefficient is close to that of the heteroepitaxial structure. The carrier body typically is in wafer form, having two parallel major surfaces. On one of the major surfaces are contact pads that are arranged in mirror fashion with regard to those on the surface of the multilayer structure. Appropriate conductor lines (preferably buried) connect the contact pads to appropriately placed contacts (typically at the periphery of the carrier body) that facilitate electrically contacting the contact pads. Carrier bodies of the contemplated type are known (see, e.g., U.S. Pat. No. 4,675,717), and are used in "wafer-scale integration" interconnect technology.

Mounting of the multilayer structure on the carrier must be such that the relevant contact pads on the carrier body are electrically connected to the corresponding pads on the surface of the multilayer structure, while providing insulation between non-corresponding pads. Furthermore, the mounting must be such that the resulting assembly can tolerate the subsequent processing. Optionally, the substrate portion (11) of the multilayer structure can be mechanically or chemically thinned (e.g., by polishing) prior to mounting or subsequent thereto. This can be done by known methods.

Figure 5:
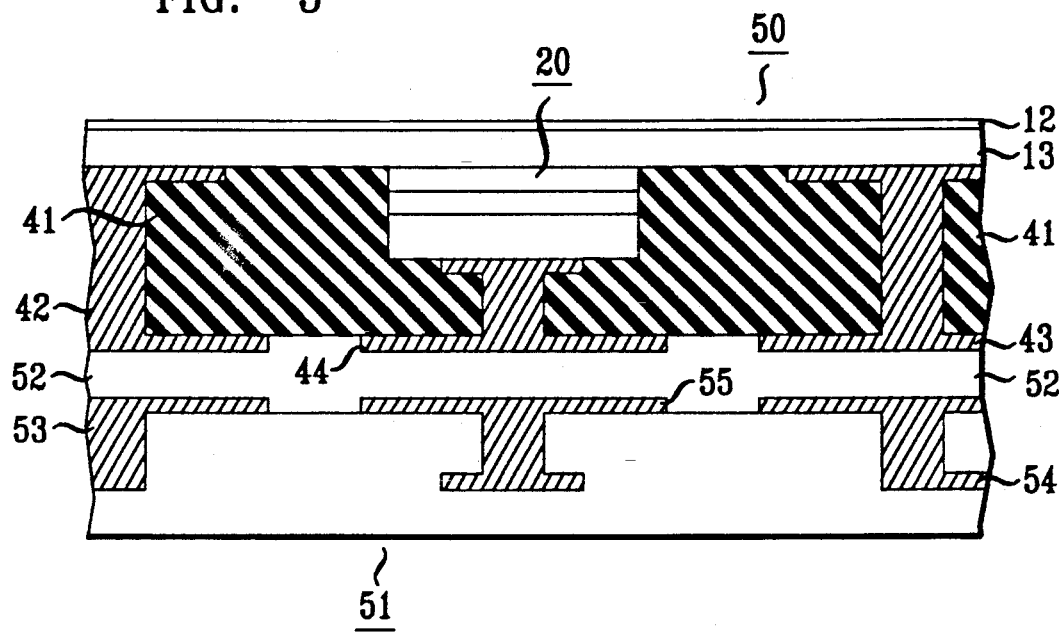

The multilayer structure can be mounted on the carrier body by any appropriate method, e.g., by the known means of solder bumps. A currently preferred mounting method uses a unidirectionally conducting interconnection medium of a type described in, for instance, U.S. patent application Ser. No. 07/755,704, "Surface Mount Assembly of Devices Using AdCon Interconnection", filed Sep. 6, 1991 for D. W. Dahringer et al. Subsequent to mounting the multilayer structure on the carrier body, the remaining substrate material (11) is removed, typically by etching. A suitable etch for removal of InP substrate material is $3HCl + 1H_2O_2 + 5H_2O$. As is well known, this etch is extremely selective between InP and InGaAs. Thus, etching essentially ceases at the InGaAs etch stop layer 12, resulting in an assembly 50 as depicted schematically in FIG. 5. Numeral 51 refers to the carrier body, 52 to the unidirectionally conducting medium which provides electrical continuity between corresponding contact pads 53 and 42, 54 and 43, and 55 and 44, but provides open circuits between non-corresponding contact pads (e.g., 54 and 44). As FIG. 5 schematically indicates, buried conductor lines connect contact pads 53–55 to the periphery of the carrier body.

Figure 6:
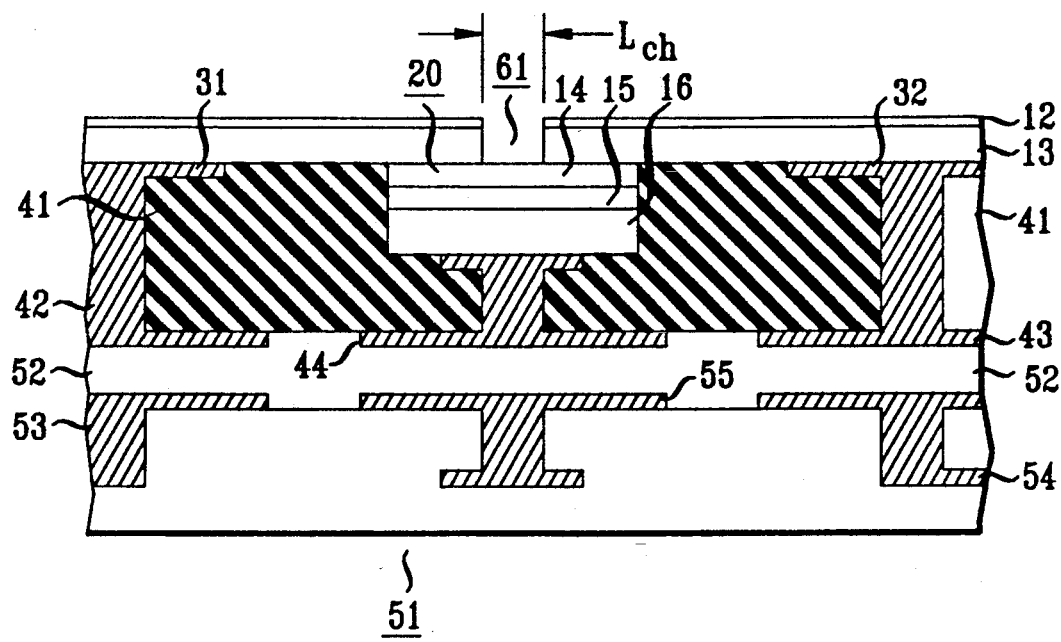
FIG. 6 shows schematically the exemplary RST device affixed to device carrier means, with substrate material removed from the device and a trench etched through the emitter contact layer.

Substrate removal is followed by trench lithography and etching, all by conventional means, as schematically depicted in FIG. 6. Trench 61 had width $L_{ch}$ in the lateral direction and makes possible heating of carriers by application of an appropriate voltage between emitter contacts 31 and 32. Those skilled in the art will appreciate that $L_{ch}$ corresponds to the effective channel length. The spacing $L_c$ between the emitter contacts is much larger than $L_{ch}$. Exemplarily the former is greater than 5 μm, even greater than 10 μm, and the latter is less than or equal to 1 μm. Furthermore, the width of the mesa (W) is greater than $L_{ch}$, and is generally less than $L_c$. This device geometry can result in desirable device characteristics, e.g., in reduced parasitic capacitance, as compared to prior art geometries.

The above described embodiment of the invention is exemplary only, and other device geometries are possible. For instance, another possible embodiment comprises a multilayer structure wherein the collector layer(s) is (are) formed on the substrate, with the emitter contact layer on top of the multilayer heteroepitaxial structure (with the collector exemplarity comprising p-type material, such that the resulting device is a light-emitting RST device).

Figure 7:
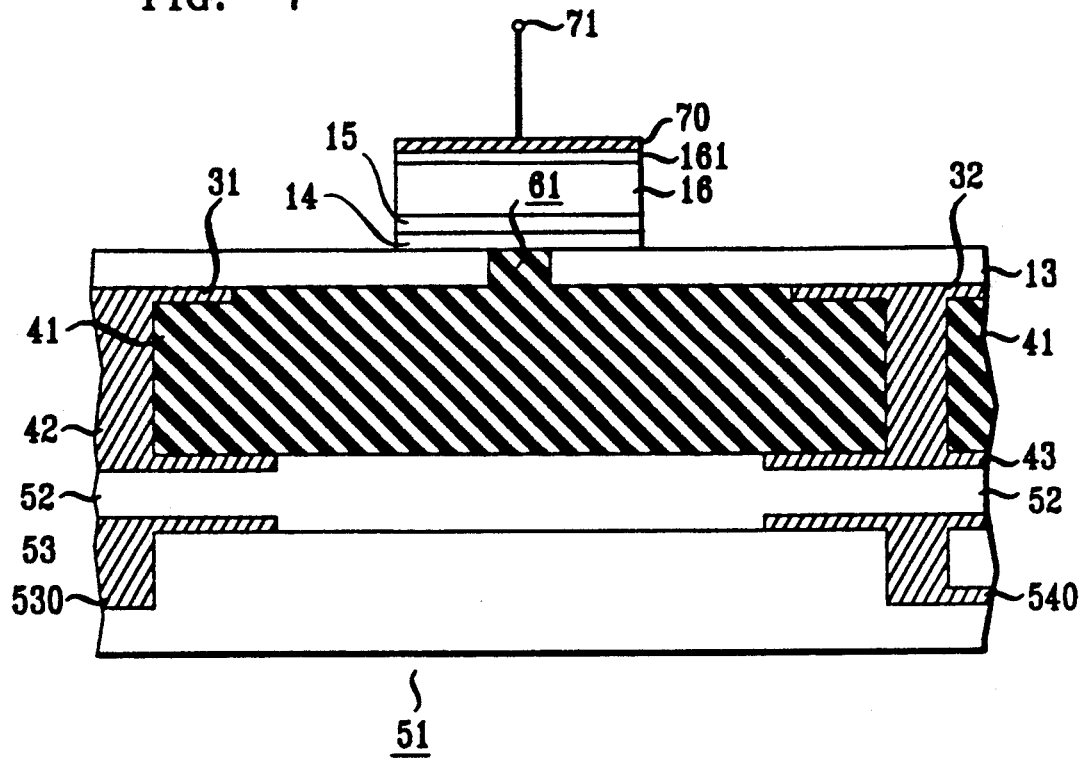
FIG. 7 schematically depicts a further exemplary RST device according to the invention, also affixed to device carrier means.

Modifying the disclosed method as required (e.g., by forming the trench prior to mounting of the structure on a device carrier and by forming the mesa after removal of the bulk semiconductor material), a device as shown schematically in FIG. 7 can be made. In FIG. 7, numeral 51 refers again to the device carrier, with 530 and 540 referring to metal pads with buried conductor lines, 52 is again a unidirectionally conductive adhesive layer, 41 an appropriate dielectric layer (e.g., silicon nitride), 42 and 43 emitter contact pads, 31 and 32 emitter contacts, 13-16 emitter contact layer, emitter layer, barrier layer and collector, respectively. Numeral 161 refers to a n++InGaAs cap layer, 70 to a metal contact, and 71 to means for making electrical contact to the collector.

I claim:

1. An article comprising a real space transfer (RST) semiconductor device, associated with the device is a longitudinal and a lateral direction and an active region, the device comprising, in sequence, a) a first epitaxial semiconductor region comprising a layer having relatively low sheet carrier concentration, said layer to be referred to as the emitter layer, and further comprising a patterned semiconductor layer having relatively large sheet carrier concentration and being in contact with the emitter layer, said patterned semiconductor layer to be referred to as the emitter contact layer, the emitter layer having a width W in the lateral direction;

b) an essentially undoped second epitaxial semiconductor region comprising a semiconductor layer in contact with the emitter layer, said semiconductor layer to be referred to as the barrier layer;

c) a third epitaxial semiconductor region in contact with the barrier layer and comprising doped semiconductor material;

d) means for making electrical contact to the third semiconductor region; and e) at least two spaced apart means for making electrical contact to the emitter contact layer, with each of the means of d) and e) comprising a contact metal region, the lateral distance between the at least two spaced apart contact metal regions being $L_c$;

f) the emitter contact layer is patterned such that a feature, of width $L_{ch}$ in the lateral direction, separates two portions of the emitter contact layer, with $L_{ch} \leq 5$ μm, each of said two portions of the emitter contact layer being associated with one of said at least two means of e), said feature to be referred to as the trench; and g) the third semiconductor region comprises a layer of doped epitaxial semiconductor material, said layer to be referred to as the collector layer, the collector layer having a width in the lateral direction that is more than W, with W being at most 50 μm, the trench being directly opposite the collector layer.

2. Article of claim 1, wherein the thickness of the barrier layer is less than 10 μm, W is less than 10 μm, $L_{ch}$ is less than 1 μm, and W is less than $L_c$, wherein substantially all of the semiconductor material in the active region of the device is epitaxial semiconductor material.

3. Article of claim 1, wherein the collector layer comprises a multiplicity of semiconductor layers.

4. Article of claim 1, wherein the collector layer comprises material of the same conductivity type as the emitter layer.

5. Article of claim 1, wherein the collector layer comprises material of the opposite conductivity type as the emitter layer, the RST device being a light emitting device.

6. Article of claim 1, wherein the emitter layer has n-type conductivity.

7. Article of claim 1, wherein the RST device comprises III/V semiconductor material selected from the group consisting of InP, InGaAs, InAlAs, GaAs, and AlGaAs.

8. Article of claim 1, further comprising device carrier means having a major surface, with patterned conductive material on the major surface, with the RST device affixed to said carrier means such that at least one of said contact metal regions makes electrical contact with said patterned conductive material.

9. Article of claim 8, wherein all three contact metal regions make electrical contact with said patterned conductive material.

10. Article of claim 8, wherein the RST device is affixed to the device carrier means by means that comprise a unidirectionally conductive interconnection medium.

* * * * *